United States Patent
Paik et al.

(10) Patent No.: US 8,625,244 B2
(45) Date of Patent: Jan. 7, 2014

(54) SYSTEM AND METHOD FOR CIRCUIT OVERCURRENT PROTECTION

(75) Inventors: Namwook Paik, Acton, MA (US); Vishwas M. Deokar, Nashua, NH (US)

(73) Assignee: Schneider Electric IT Corporation, West Kingston, RI (US)

( * ) Notice: Subject to any disclaimer, the term of this patent is extended or adjusted under 35 U.S.C. 154(b) by 17 days.

(21) Appl. No.: 13/242,713

(22) Filed: Sep. 23, 2011

(65) Prior Publication Data

US 2012/0126785 A1    May 24, 2012

Related U.S. Application Data

(62) Division of application No. 11/650,391, filed on Jan. 5, 2007, now Pat. No. 8,031,455.

(51) Int. Cl.
*H02H 9/00* (2006.01)
*H02H 5/04* (2006.01)

(52) U.S. Cl.
USPC .......................................... 361/93.2; 361/104

(58) Field of Classification Search
USPC ................................................ 361/93.2, 104
See application file for complete search history.

(56) References Cited

U.S. PATENT DOCUMENTS

| | | | |
|---|---|---|---|
| 4,694,373 A | 9/1987 | Demeyer | |
| 5,170,311 A | 12/1992 | Zulaski et al. | |
| 5,835,325 A | 11/1998 | Tripodi et al. | |
| 5,943,203 A | 8/1999 | Wang | |
| 6,031,703 A | 2/2000 | Serpinet et al. | |
| 6,397,155 B1* | 5/2002 | Przydatek et al. | 702/61 |
| 6,600,641 B2 | 7/2003 | Oglesbee et al. | |
| 6,606,047 B1* | 8/2003 | Borjesson et al. | 341/155 |
| 6,721,672 B2 | 4/2004 | Spitaels et al. | |
| 7,286,010 B2* | 10/2007 | Chieng et al. | 330/10 |
| 8,031,455 B2 | 10/2011 | Paik et al. | |
| 2002/0027758 A1 | 3/2002 | Oglesbee et al. | |
| 2005/0128872 A1* | 6/2005 | Valero et al. | 367/34 |
| 2006/0221521 A1 | 10/2006 | Veroni | |
| 2007/0103833 A1 | 5/2007 | Harris | |
| 2008/0218395 A1* | 9/2008 | Tomioka et al. | 341/155 |
| 2008/0225457 A1* | 9/2008 | Korrek | 361/100 |
| 2011/0095817 A1* | 4/2011 | Yamada | 330/98 |

FOREIGN PATENT DOCUMENTS

| | | |
|---|---|---|
| EP | 1 132 744 A2 | 9/2001 |
| EP | 1643629 A2 | 4/2006 |
| EP | 2 017 867 B1 | 9/2010 |
| JP | 9 322385 A | 12/1997 |

(Continued)

OTHER PUBLICATIONS

International Search Report and Written Opinion from corresponding International Application No. PCT/US2008/050134 dated Jul. 15, 2008.

(Continued)

*Primary Examiner* — Scott Bauer
(74) *Attorney, Agent, or Firm* — Lando & Anastasi, LLP

(57) ABSTRACT

In one aspect, the invention provides a method for overcurrent sensing including; generating an analog output signal representative of a sensed AC current, generating a digital representation of the analog output signal using a plurality of discrete samples, determining those of the plurality of discrete samples having a substantially identical magnitude and estimating an amount of overcurrent in the sensed AC current by evaluating those of the plurality of discrete samples that have the substantially identical magnitude. In some embodiments, the substantially identical magnitude is a maximum magnitude represented by the digital representation.

8 Claims, 10 Drawing Sheets

(56) References Cited

FOREIGN PATENT DOCUMENTS

| RU | 1803586 A1 | 3/1993 |
|---|---|---|
| WO | 2004/093283 A1 | 10/2004 |
| WO | 2007/014725 A1 | 2/2007 |

OTHER PUBLICATIONS

Extended European Search Report from corresponding Application No. 12190666.3 dated Feb. 22, 2013.

* cited by examiner

SYSTEM AND METHOD FOR CIRCUIT OVERCURRENT PROTECTION

CROSS REFERENCE TO RELATED APPLICATIONS

This application is a divisional of and claims the benefit under 35 U.S.C. §120 to U.S. application Ser. No. 11/650,391, filed on Jan. 5, 2007 now U.S. Pat. No. 8,031,455 entitled "SYSTEM AND METHOD FOR CIRCUIT OVERCURRENT PROTECTION", which is hereby incorporated herein by reference in its entirety for all purposes.

BACKGROUND OF INVENTION

1. Field of the Invention

Embodiments of the invention relate generally to circuit overcurrent protection. More specifically, at least one embodiment relates to a system and method for isolating circuit protective devices.

2. Discussion of Related Art

In general, overcurrent protection for electrical circuits is provided by circuit breakers, fuses, or a combination of the two. These protective devices are selected and applied according to their current ratings to protect electrical circuits including electrical wires and cables as well as electrical appliances, motors, transformers and other electrical loads. Often an electrical system includes a main circuit breaker or main fuse that supplies a plurality of branch circuits that may each include a separate protective device.

As used herein, the term "circuit protective device" refers to a device that provides overcurrent protection including overcurrent sensing and circuit isolation in response to one or more pre-determined overcurrent conditions.

Generally, a fuse includes a metal wire or strip that will melt when heated by a predetermined amount of electrical current. The fuse rating or nominal current rating is the amount of continuous current that the fuse can carry without having the fuse element melt and open the circuit i.e., without having the fuse "blow". Accordingly, a 20 amp fuse can carry 20 amps on a continuous basis without opening the circuit due to over-temperature of the element in the fuse. The amount of time that the fuse will carry an overcurrent decreases as the magnitude of the current increases.

Circuit breakers are also designed to open in response to an overcurrent. Because circuit breakers are designed to be reset and closed following an overcurrent trip, they generally include mechanical or electro-mechanical operating mechanisms. Accordingly, the overcurrent protection may include a thermal element that deflects in response to an overcurrent (e.g., a residential molded case circuit breaker), and/or electronic current sensing and electronic trip units (e.g., commercial/industrial circuit breakers).

Overcurrent conditions can result from overloads and short circuits. Both circuit breakers and fuses may experience nuisance operations in which they respond to low-level overloads by opening the circuit and disconnecting the associated load. Fuses may be particularly fast acting and many electrical codes and standard-setting bodies require that fuses be employed in specific applications often because of their operating speed. However, the fast action of a fuse in an overcurrent condition can sometimes result in nuisance failures in which a fuse opens on a temporary overload and must be then replaced. Also, many circuit breakers require manual resetting after they open as a result of an overload.

Although many existing approaches to circuit protection provide a coordinated set of protective devices, the current setting of these devices (i.e., the nominal rated current of the devices) is established based on the need to protect the electrical load. As mentioned above, this can include not only operating equipment such as lighting circuitry, appliances and the like, but also the electrical wiring that connects the various elements of the circuit. Accordingly, existing approaches to circuit protection generally do not take into consideration how the thermal characteristics of the fuse may result in nuisance tripping because the design of the circuit protection is focused on the protection of the equipment and wiring that is supplied by the circuitry. In other words the operation of circuit protective devices on low level overloads is tolerated in the interest of protecting the electrical circuit and devices protected by the protection device.

Another problem with existing approaches involves the use of current sensing circuitry (e.g., a current sensor) having an analog output that is supplied to an input of an analog-to-digital converter ("ADC"). In particular, the accuracy and range of the ADC is limited by the size of the ADC (i.e., the number of bits included in the converter) and the selected resolution of the ADC. These limitations reduce the accuracy of current sensing during some overcurrent conditions. Generally, the resolution and range of the ADC are based on the nominal current rating of the circuit with which it is employed. However, the current carried in an electrical circuit can vary widely from at or below a nominal continuous current (for example, 15 or 20 amps in a residential circuit), to overload current levels that may be 2 or 3 times the nominal continuous current and to short circuit currents that may be tens or hundreds of times greater than the nominal continuous current. The above limitations on ADCs employed with current sensing circuitry may result in inaccuracies in current measurements, and accordingly, in inaccuracies in the overcurrent protection employed with the ADCs. In particular, currents above the maximum current that is accurately represented by the ADC can be "clipped." That is, the digital representation of the current waveform may have the same value for all magnitudes of current above a maximum.

Yet another problem with existing approaches to overcurrent protection schemes is the fact that consideration of thermal loading is often addressed on a circuit-by-circuit basis. That is, where a system includes a plurality of branch circuits, the thermal loading may be evaluated on a branch circuit-by-branch circuit basis and the thermal capabilities of the entire system may not be adequately addressed. For example, where a transfer switch rated for 100 amps of continuous current includes ten branch circuits each with a separate circuit breaker or fuse to protect the branch circuit, the total nominal rated current of the circuit breakers or fuse in aggregate may far exceed the nominal current rating of the transfer switch. In the preceding example, where ten circuits are each rated for 20 amps apiece, a transfer switch that supplies the ten circuits is, in theory, supplying as much as 200 amps of electrical current. Thus the transfer switch may not include a main circuit protective device and the 100-amp rated transfer switch may be overloaded without any operation of a circuit protective device. Alternatively, where a main circuit protected device is included, existing approaches may simultaneously isolate all ten circuits with the main device in an attempt to provide system wide protection. Such an approach may result in the unwanted isolation of critical loads.

SUMMARY OF INVENTION

In one aspect, the invention provides an apparatus including a current sensor configured to sense a current in a circuit protective device and to generate a signal corresponding to the sensed current, a controller that receives the signal corresponding to the sensed current, and an isolation device configured to isolate the circuit protective device. According to one embodiment, the controller is configured to estimate an accumulated thermal loading of the circuit protective device based on a thermal characteristic of the circuit protective device and the sensed current. In one embodiment, the controller is further configured to provide an output signal to activate the isolation device and interrupt the current if the accumulated thermal loading exceeds a predetermined maximum thermal loading of the circuit protective device. In another embodiment, the controller is configured to provide the output signal prior to the circuit protective device interrupting the current.

In another aspect, the invention provides an overcurrent sensing apparatus that includes current sensing circuitry configured to generate an analog output signal representative of a sensed current, an analog to digital converter configured to receive the analog output signal and generate a digital representation of the analog output signal using a plurality of discrete samples and a controller configured to estimate an amount of an overcurrent sensed by the current sensing circuitry by evaluating the samples having a substantially identical magnitude. In one embodiment, each of the plurality of discrete samples representative of the analog output signal at or above a maximum current value has the substantially identical magnitude. In another embodiment, the estimated amount of the overcurrent is determined based on a quantity of consecutive samples having the substantially identical magnitude.

In yet another aspect, the invention provides a system for protecting a plurality of circuits including a plurality of circuit protective devices wherein each circuit protective device includes a respective nominal current rating. According to one embodiment, the system includes current sensing circuitry configured to measure a current of each circuit protective device, and a controller configured to receive each of the measured currents. According to one embodiment, the controller is further configured to determine a ratio between a total current being carried by all of the circuit protective devices combined and a total nominal current rating of all of the circuit protective devices combined and employ the ratio to determine a modified nominal current rating of each circuit protective device, respectively. In a further embodiment, the controller is configured to generate an output signal to isolate a selected circuit selected from among the plurality of circuits based on the modified nominal current rating of the circuit protective device included in the selected circuit. According to a further embodiment, the controller is configured to determine each circuit protective device for which the modified nominal current rating is in excess of the nominal current rating of the device.

Another aspect of the invention is directed to a method for protecting a circuit protection device. The method includes sensing a current in the circuit protective device, generating a signal corresponding to the sensed current, estimating an accumulated thermal loading of the circuit protective device based on a thermal characteristic of the circuit protective device and the sensed current, and interrupting the current if the accumulated thermal loading exceeds a predetermined maximum thermal loading of the circuit protective device.

In the method, the predetermined maximum thermal loading may correspond to substantially an average melt time of the circuit protective device. The method may further include determining the predetermined maximum thermal loading based on a heating effect of current carried by the circuit protective device.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
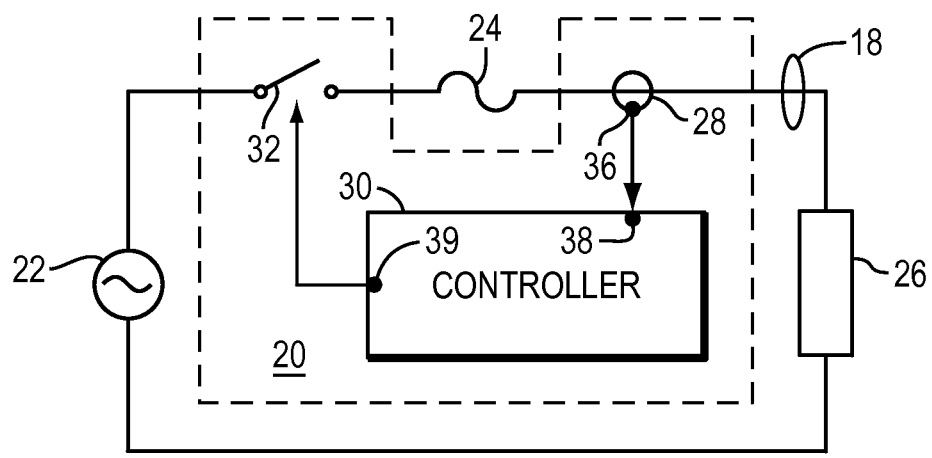
FIG. 1 is a schematic diagram of an apparatus in accordance with one embodiment of the invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

Referring now to FIG. 1, a schematic diagram of an apparatus 20 in accordance with one embodiment is illustrated. The schematic illustrates a circuit 18 including a power source 22, a circuit protective device 24, and an electrical load 26. In addition, FIG. 1 illustrates current sensing circuitry 28, a controller 30, and an isolation device 32. In accordance with one embodiment, the current sensing circuitry 28, the controller 30, and the isolation device 32 are included in the apparatus 20. The power source 22 may be an AC power source or a DC power source, in addition, where the power source 22 is an AC power source, it may include one or a plurality of phases. Although illustrated as a fuse, the circuit protective device 24 may be a fuse, a circuit breaker, a combination of the preceding and/or some other circuit protective device that operates in response to an overcurrent condition to isolate the circuit 20. Further, the circuit protective device may be a single phase device or a multi-phase device depending upon the application. Generally, the circuit protective device 24 physically opens the current path between the power source 22 and the load 26 when it operates in response to an overcurrent condition. For example, most fuses include an internal current-carrying element (e.g., a metal element) that melts within a predetermined amount of time which varies depending upon the magnitude of the overcurrent. In general, circuit breakers include one or more current-carrying contact pairs which open to interrupt current flow in response to an overcurrent sensed by a thermal element or current sensing circuitry associated with the circuit breaker.

In various embodiments, the current sensing circuitry 28 may include a current transformer, a shunt, a hall-effect sensor or other means of sensing current flow in the circuit. According to one embodiment, the current sensing circuitry 28 includes an output 36.

In accordance with one embodiment, the controller 30 may include an analog-to-digital converter ("ADC"), one or more processors and a memory. In accordance with one embodiment, the controller 30 includes a TI DSP 2801 microcontroller manufactured by Texas Instruments which can provide a CPU, an ADC and memory in a single chip. Accordingly, the controller 30 may be implemented in a microprocessor or microcontroller executing embedded software and/or firmware instructions. In accordance with one embodiment, the controller may also include an input 38 and an output 39. In a version of this embodiment, the input 38 is connected to the output 36 of the current sensing circuitry and the output 39 of the controller is connected to the isolation device 32. In other embodiments, additional outputs may be included to provide external signals from the controller that may indicate an overcurrent condition In accordance with one embodiment, the isolation device 32 may be a relay, circuit breaker or other device that may be electrically operated to open upon receipt of a signal from the controller 30. Further, embodiments of the isolation device may also be electrically operated to close upon receipt of a close-signal from the controller 30 or other apparatus.

In addition, the circuit protective device 24 may be a single-phase device or a multi-phase device depending upon the application.

Figure 2:
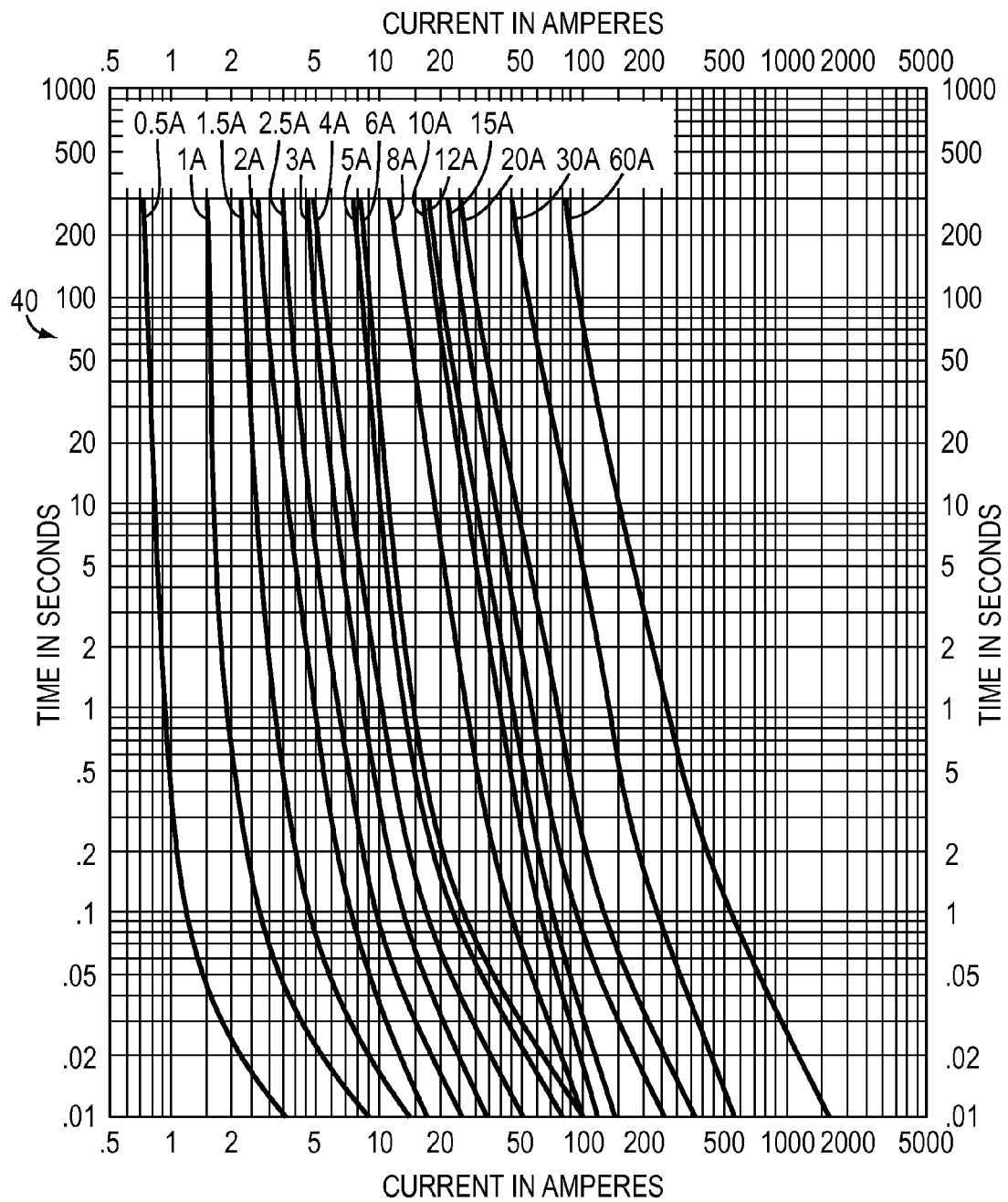
FIG. 2 is a plot of time-current characteristic curves for circuit protective devices.

FIG. 2 illustrates a set of time-current characteristic curves 40 (or average melt time) for a "family" of fuses, for example, Cooper Bussman Class G time-delay fuses. For example, the left most curve illustrates time-current characteristics of a one-half amp fuse while the right most curve illustrates the time-current characteristics of a 60 amp fuse. In FIG. 2, the Y-axis includes the time in seconds while the X-axis includes current in amperes and each axis is plotted on a logarithmic scale. Each curve represents the average melt time as the current increases from left to right. As is apparent, the average melt time decreases as the current increases.

In FIG. 2, the ampere rating of the fuses identifies the nominal continuous current rating of the fuse. That is, an amount of current that the fuse can carry continuously for an indefinite period (at least in theory). As one example, referring to the curve for the 20 amp fuse, the fuse will carry 100 amperes for approximately 0.25 seconds at which time the thermal effects of the current on the fuse element will melt the fuse element and open the circuit within the fuse. Other examples may also provide similar information concerning an amount of time that the fuse will carry a given current before operating (i.e., before blowing). Time-current characteristic curves may also be provided for other protective devices, for example, thermally operated circuit breakers and solid state circuit breakers that employ an electronic current sensing.

In accordance with one embodiment, the thermal characteristics of circuit protective device 24 are determined and provided to the controller 30. The controller 30 includes one or more algorithms that are employed to determine the current carried by the circuit, based on the input supplied by the current sensing circuitry 28. The algorithm may also determine an accumulated thermal loading on the circuit protective device 24. In a further embodiment, the controller 30 may be provided with a maximum allowable thermal loading of the circuit protective device. In this embodiment, the algorithm may be employed to determine whether the accumulated thermal loading exceeds the maximum allowable thermal loading of the circuit protective device 24.

In accordance with one embodiment, the controller 30 generates a signal at the output 39 when the accumulated thermal loading exceeds the maximum allowable thermal loading of the circuit protective device 24. The signal may be communicated to the isolation device 32 which operates to open and interrupt current flow in the circuit 18 in response to the signal. In at least one embodiment, the system is configured to interrupt current flow before the circuit protection device "blows."

Figure 3:
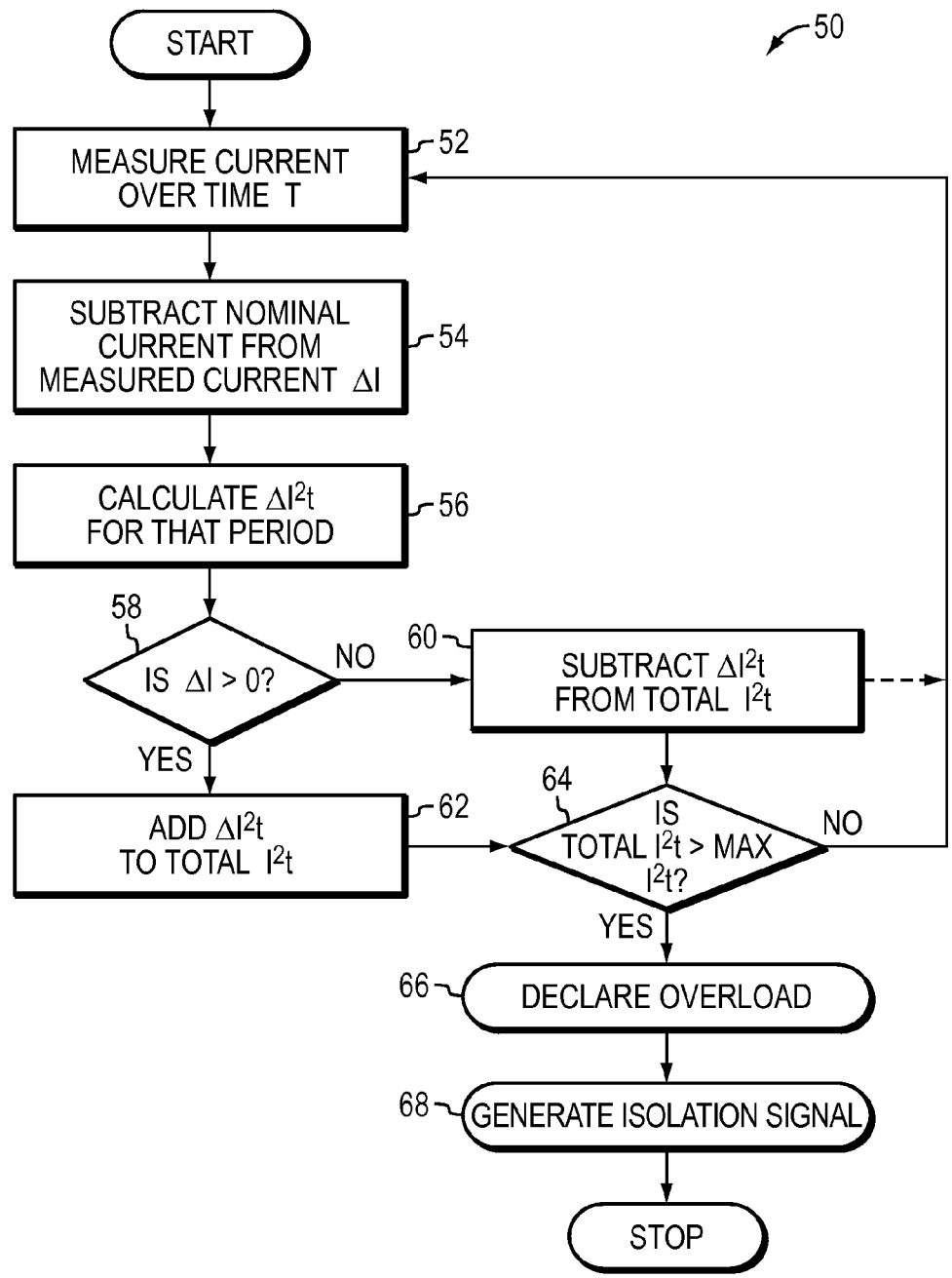
FIG. 3 is a flow diagram of a process in accordance with one embodiment of the invention.

Referring now to FIG. 3, a flow diagram of a process 50 is illustrated in accordance with one embodiment. The process 50 provides an example in which the apparatus 20 may be employed to prevent an unwanted operation of the circuit protective device 24 while continuing to provide overcurrent protection to the circuit in which the circuit protective device 24 is employed. In general and in accordance with one embodiment, the process 50 employs a comparison of a cumulative thermal loading of the circuit protective device 24 to a desired maximum thermal loading of the circuit protection device. In one embodiment, the comparison is employed to determine whether the controller 30 should provide a signal to operate the isolation device 32 and isolate the circuit prior to operation of the circuit protective device.

According to one embodiment, a maximum thermal loading is determined based on the time-current characteristics of the circuit protective device at a single point on the time-current curve. For example, a current greater than the nominal current of the circuit protective device may be selected and the thermal loading (calculated as a function of $I^2t$) determined for the selected current. In one embodiment, the amount of time used in the calculation is determined from the time-current characteristic curve. Referring again to FIG. 2, if a 60 amp current is used to determine the thermal loading for the 20 amp rated circuit protective device, a time of 2.5 seconds or less can be used to determine the thermal loading that causes the 20 amp circuit protective device to operate. In this example, for the 20 amp circuit protective device, a maximum thermal loading determined for 60 amps of current is:

$$\text{Max Thermal Loading}=(60)(60)2.5=9000 \qquad \text{Eq. 1}$$

In other words, to prevent operation of the circuit protective device 24, the apparatus 20 should be configured to operate the isolation device 32 within 2.5 seconds when the circuit protective device is carrying 60 amps.

According to one embodiment, the maximum $I^2t$ is determined based on the difference between the nominal rated current and the current at the selected point on the time-current curve. In this example, the nominal current rating is 20 amps and the selected overcurrent is 60 amps. Accordingly, the max $I^2t$ is determined as:

$$\text{Max } I^2t=(60-20)(60-20)2.5=4000 \qquad \text{Eq. 2}$$

In some embodiments, the cumulative thermal loading is evaluated to determine whether a maximum thermal loading has been reached. For example, where the sensed current is evaluated as a plurality of discrete samples I-n each having a duration of time $t_s$, a contribution of the current sensed to the total $I^2t$ effect of the current for each sample period may be determined according to Equation 3.

$$\text{Contribution to Max } I^2t=(I_n-20)(I_n-20)t \qquad \text{Eq. 3}$$

Further, according to one embodiment, any current at or below the nominal current rating does not contribute to a cumulative thermal load on the circuit protective device, and may decrease the cumulative thermal loading. That is, where the current is at the nominal current rating (e.g., 20 amps) the current does not effect the cumulative thermal loading of the circuit protective device. Where the current is less than the nominal current rating (e.g., less than 20 amps) the current reduces the cumulative thermal loading by an amount $I^2t$:

$$\text{where, } I = \Delta I = |I_{at\ time\ t} - I_{rated}| \qquad \text{Eq. 4}$$

In accordance with the illustrated embodiment, the process 50 includes an act 52 in which the current is measured over a first time increment. In one embodiment, the current is sensed by the current sensing circuitry 28 and communicated to the controller 30. In one version of this embodiment, the current sensing circuitry 28 provides an analog output signal to the controller 30 and the controller 30 converts the signal to a digital signal that includes a discrete set of samples of the analog current waveform.

In accordance with one embodiment, the process also includes an act 54 in which the nominal current rating of the circuit protective device is subtracted from the current measured at act 52 to determine a value of $\Delta I$. For example, referring again to a 20 amp fuse, the nominal current rating of the fuse is 20 amps.

Further, in one embodiment, the process 50 includes an act 56 in which the contribution of the current to the thermal loading of the circuit protective device is determined for the period in which the current was measured at act 52.

In a further embodiment, process 50 includes an act 58 in which the difference in current determined at act 54 is evaluated to determine whether it is greater than zero. In one embodiment, act 58 also includes an act of determining an absolute value of the difference between the current for the period and the nominal rated current of the circuit protective device (e.g., as shown in Eq. 2) while in another embodiment the absolute value is determined at act 56. As mentioned above, a current that is less than the nominal rated current can decrease the cumulative thermal loading while a current that is greater than the nominal rated current can increase the cumulative thermal loading.

In accordance with one embodiment, where the value determined at act 54 is less than or equal to zero, the process 50 proceeds to act 60. At act 60, the contribution of the current to the accumulated thermal loading determined at act 56 for the time period is applied to the cumulative thermal loading of the protective device. In one embodiment, the $I^2t$ value determined at act 56 (e.g., $\Delta I^2t$) is subtracted from the cumulative thermal loading. According to one embodiment, values of the cumulative thermal loading that are less than zero are rounded to zero if the result of act 60 is a negative value.

According to one embodiment, act 60 is followed by act 64 (described in greater detail below) while an alternative embodiment, the process 50 proceeds to act 52 (for a subsequent time period) following act 60.

Where the value determined at act 54 is greater than zero, the process 50 proceeds to act 62. At act 62, the contribution of the current to the accumulated thermal loading, (determined at act 56 for the time period) is applied to the cumulative thermal loading of the protective device. In one embodiment, the $I^2t$ value determined at act 56 is added to the cumulative thermal loading.

Following act 62, the process 50 proceeds to act 64 where a determination is made whether the total cumulative thermal loading is greater than the maximum thermal loading determined for the circuit protective device. As described above, the maximum thermal loading may be determined based on one or more points along the time-current characteristic curve.

In accordance with a further embodiment, the process 50 proceeds to act 66 if it is determined that the cumulative thermal loading is greater than the maximum thermal loading of the circuit protective device. At act 66, an overload is declared. Various embodiments may establish overload levels that are at or less than the maximum thermal loading determined by one or more points located on the time-current characteristic curve of the overcurrent protective device. This approach may provide a margin of error to insure that the isolation device operates more quickly than the circuit protective device when a relatively low level overcurrent (e.g., an overload as opposed to a short circuit) occurs. Such an approach provides protection while preventing the circuit protective device from operating. For example, the apparatus 20 may allow a 60 amp current to remain on the circuit for 2 seconds instead of the 2.5 seconds provided for by the circuit protective device. Accordingly, in this example, the maximum $I^2t$ may be established as (40)(40)2=3200 rather than 4000.

At act 66, an overcurrent condition is declared. In some embodiments, at act 68, the controller 30 provides a signal at the output 39 to operate the isolation device 32 when an overcurrent is declared. The controller 30, however, may be configured to provide for other responses alone or in addition to the preceding. For example, the controller may provide a signal to a user interface to identify an overcurrent condition prior to either the operation of the isolation device or the circuit protective device.

In a further embodiment, where at act 64, the cumulative thermal loading is determined to be less than the maximum thermal loading for the circuit protective device, the controller evaluates one or more subsequent current measurements for additional period(s) and begins the process 50 for that subsequent current measurement.

In one specific example, the process 50 results in the following where each period is one cycle of a 60 Hz signal (approximately 16.7 msecs): 1) the continuous current is 20 amps or less and the cumulative $I^2t$ total remains at zero; 2) the load current increases to 60 amps continuous and for each period the $\Delta I^2t$ added to the cumulative total is 26.72; 3) after 150 periods the cumulative thermal loading reaches the maximum allowable thermal loading. Because 60 amps and 2.5 seconds were employed to establish the maximum allowable thermal loading in this example, the amount of time that the overload is sustained (i.e., the amount of time before the controller 30 declares an overload and operates the isolation device 32) is the product of 150 periods and (0.0167 secs/period)–2.5 seconds.

As is seen from the preceding, the use of a single point on which the maximum $I^2t$ is based results in an approximation of the allowable thermal loading at other points. This approximation may be employed to provide a margin that assures that the circuit protective device will be isolated well in advance of the time at which the overcurrent protection device will operate. That is, the circuit protective device operates more slowly at lower levels of overcurrents. Referring again to the example of a 20 amp circuit protective device, a 50% overload (i.e., 30 amps) will not reach the corresponding maximum thermal rating of the circuit protective device until the current is sustained for approximately 100 seconds. Therefore, the previous maximum $I^2t$ calculations based on 2.5 seconds can act to de-rate the circuit protective device.

Although, the preceding provides a conservative approach, another embodiment employs a further approach to determining the maximum allowable $I^2t$. In summary, this approach determines the incremental heating effect $\Delta I^2t$ to be added for each sample period by first determining a curve fit for the time-current characteristic curve of the circuit protective device and then employing the equation that generates the curve fit to determine the incremental heating effect.

Figure 4:
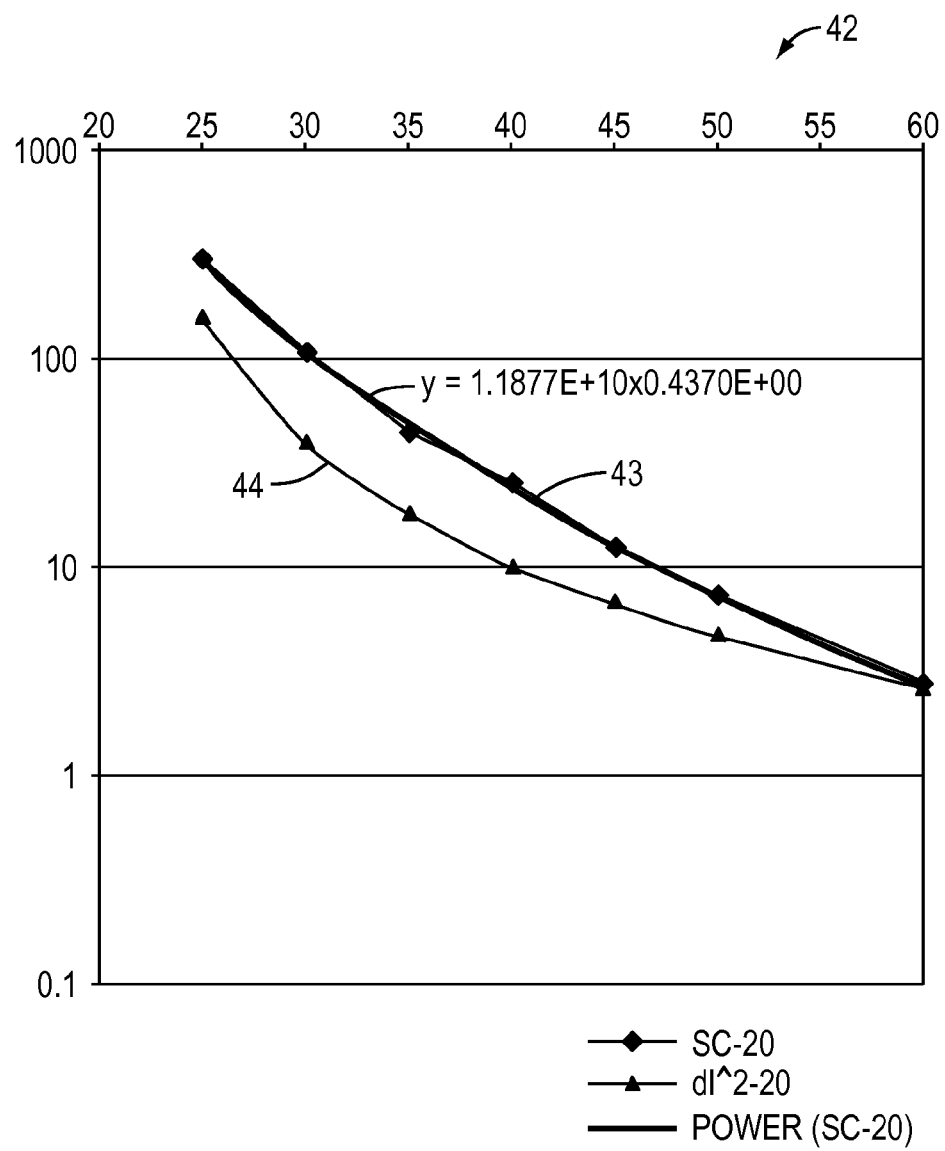
FIG. 4 is a plot of time-current characteristic curves in accordance with another embodiment.

Referring to FIG. 4, in accordance with this embodiment, a plot 42 is illustrated for a circuit protective device. The plot 42 includes a first curve 43, and a second curve 44. These curves are plotted using an x-axis in current and a logarithmic y-axis in seconds. The first curve 43 represents a curve fit to closely match the time-current characteristic curve for the 20 amp protective device (the curve 43 is overlaid on the actual time current characteristic curve). The second curve 44 represents the maximum allowable thermal loading for the 20 amp protective device when a single point is employed according to the previous embodiment. That is the second curve 44 is based on an allowable $I^2t$ where $t=2.5$ seconds for all current values. As is seen from these plots, the previous embodiment provides a lower maximum thermal loading for overloads in which the overload current is less than the current associated with the single point at which the maximum thermal loading is determined. Referring to the previous example, which is illustrated in the curves 43 and 44, for the 20 amp protective device, overload currents less than 60 amps will cause the controller to signal the isolation device to isolate the circuit protective device well in advance of the thermal loading that operates the circuit protective device itself (represented by the curve 43).

In accordance with one embodiment, the curve fit for the 20 amp protective device results from an equation in which:

$$Y = (A \times 10^{10}) X^B \qquad \text{Eq. 5}$$

where $A=1.1877$ and $B=-5.437$, and accordingly $$Y = (1.1877 \times 10^{10}) X^{-5.437} \qquad \text{Eq. 6}$$

The coefficients A and B can be determined using curve fitting techniques well-known to those skilled in the art.

According to this embodiment, the incremental heating effect $\Delta I^2t$ to be added for each sample is determined as:

$$\Delta I^2 t = A/I^B \qquad \text{Eq. 7}$$

As a result, one embodiment is employed to allow a maximum thermal loading that more closely corresponds to the rated maximum thermal loading of the circuit protective device itself.

Figure 5:
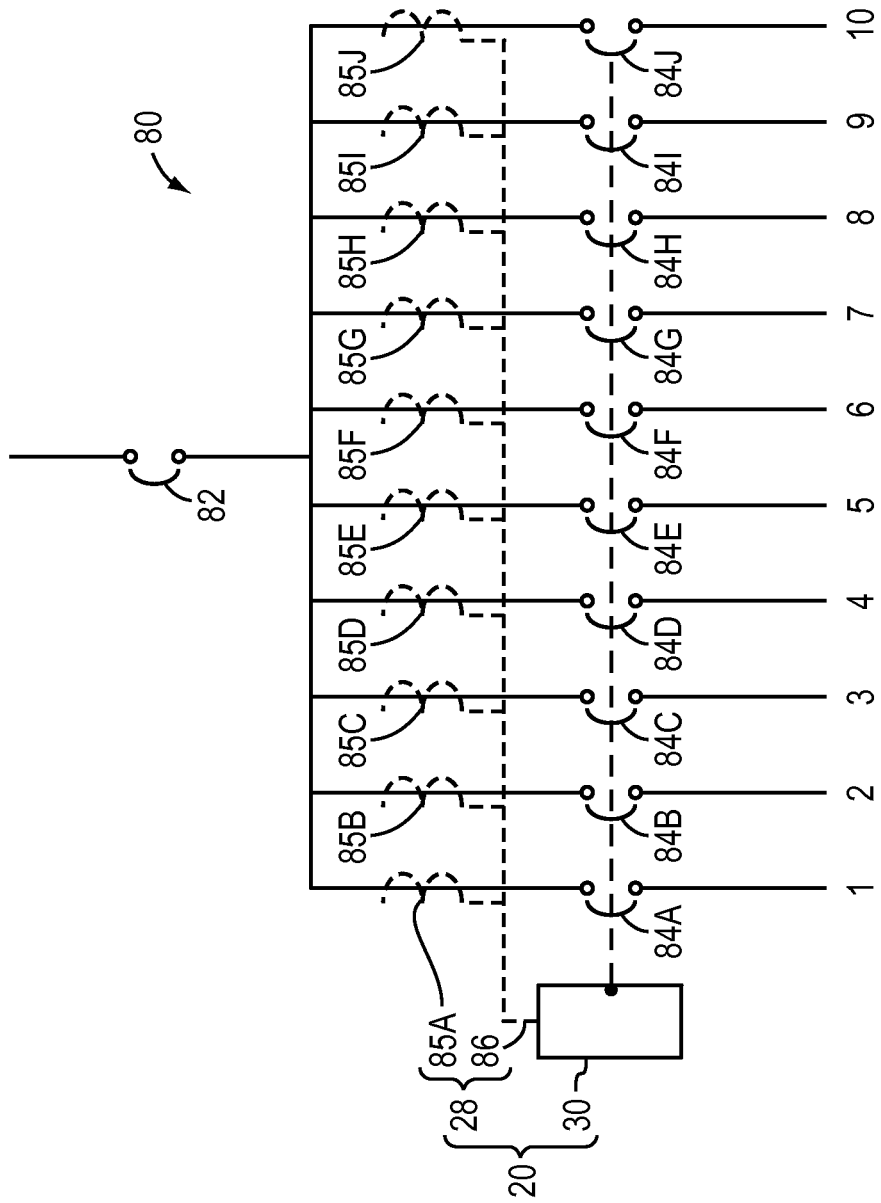
FIG. 5 is a one line diagram of a system in accordance with one embodiment of the invention.

Referring now to FIG. 5, an electrical system 80 is schematically illustrated in accordance with one embodiment. The electrical system 80 may include a main circuit protective device 82 and a plurality of load circuit protective devices 84A-84J where the protective devices are fuses, circuit breakers, relays or any combination of the preceding. In one version, each of the load circuit protective devices 84A-84J are included in one of the circuits 1-10, respectively. In one embodiment, the electrical system is included in a transfer switch that supplies power to the load circuit protective devices 84. In some embodiments, the transfer switch is configured to supply power from any one of a plurality of power sources.

The electrical system includes an apparatus that includes a controller 30 and current sensing circuitry 28. In the illustrated embodiment, the current sensing circuitry includes a plurality of current sensors 85A-85J that are connected to the controller 30 by wiring 86. In one embodiment, each current sensor 85A-85J senses current in one of the circuits 1-10, respectively. Although the wiring 86 is schematically represented as a single circuit, in various embodiments, the wiring 86 includes a plurality of circuits where, for example, each circuit is connected to one of the current sensors 85A-85J, respectively. In addition, a current sensor may also be associated with the main circuit protective device 82. In some embodiments, the current sensors 85 may be integral to the associated circuit protective device. In an alternate embodiment, the current sensors 85 are not a part of the associated circuit protective device and the circuit protective device may (e.g., a circuit breaker) include another current sensor that is employed with integral overcurrent protection included in the circuit protective device. As is recognized by those of ordinary skill in the art, where the circuit protective device is a fuse, the current sensor is not included in the circuit protective device.

In various embodiments, the circuit protective devices 82, 84 may include a remotely controlled trip function, a remotely controlled close function or both as is well known by those of ordinary skill in the art. These remotely controlled operations allow the opening and closing of the circuit protective device, respectively, upon receipt of a control signal from a device (e.g., an electrical or electronic control element) that is not integral to the load circuit protective device. The device may be included in equipment (e.g., an electrical enclosure) that also houses the load circuit protective devices 84. Alternatively, the device may be physically remote, for example, in a different enclosure, room or building.

In accordance with one embodiment, the apparatus 20 generally operates as described concerning the embodiment illustrated in FIG. 1. That is, the controller 30 generates a signal used to isolate a protective device 82, 84 in advance of the operation of the protective device in response to an overload. In accordance with one embodiment, the circuit protective devices 82, 84 include a remotely controlled trip function and the controller 30 is configured to generate trip signals used to isolate the circuits 1-10 as is described in greater detail below.

Accordingly, in one embodiment, the circuit protective devices 82, 84 are electrically operated. That is, the circuit protective devices 82, 84 are circuit breakers or relays that include at least a remote trip function. In addition, they may also include a remote close function.

In an alternate embodiment, one or more of the circuit protective devices 82, 84 is a fuse or other non-electrically operated protective device and the apparatus 20 includes a separate isolation device that is associated with each of the non-electrically operated protective devices, for example, an isolation device (e.g., isolation device 32) as originally described with reference to FIG. 1. Accordingly, in one embodiment, a separate isolation device is employed in combination with each the load circuit protective device 84 for each of the circuits 1-10.

Further, although the current sensors are illustrated as a single element, the current sensing circuitry 28 may include a plurality of current sensors, for example, a sensor for each phase of a polyphase circuit (e.g., any of the circuits 1-10).

In one or more embodiments, one or more of the load circuit protective devices 84 is electrically operated, e.g., electrically operated circuit breakers. In general, according to these embodiments, the controller 30 may operate to open the load circuit protective device 84 in response to a current sensed in the associated circuit. For example, the controller 30 may operate the load circuit protective device 84C in response to a current sensed in the circuit 3 by the current sensor 85C.

In accordance with one embodiment, the apparatus 20 operates to isolate one or more of the circuits 1-10 based on an aggregate loading of the electrical system 80. For example, the total current carrying capacity of the electrical system may be 100 amps. Accordingly, the main circuit protective device may include a nominal continuous current rating of 100 amps. The ratings of the individual load circuit protective devices 84 in aggregate, however, may exceed the nominal continuous current rating of the main circuit protective device 82. That is, where circuits 1-10 each include a nominal continuous current rating of 20 amps, the aggregate continuous current rating of the load circuit protective devices is 200 amps which is twice the continuous current rating of the electrical system 80 and the main circuit protective device 82.

In one embodiment, for example, the electrical system 80 (e.g., included in a transfer switch) is rated to supply a maximum of 100 amps of continuous current, the circuits 1-10 are each protected by a 20 amp fuse and are loaded as indicated in Table 1.

TABLE 1

| Circuit | Measured Current in Amps |
|---|---|
| 1 | 15 |
| 2 | 20 |
| 3 | 5 |
| 4 | 18 |
| 5 | 8 |
| 6 | 12 |
| 7 | 19 |
| 8 | 7 |
| 9 | 14 |
| 10 | 14 |
| Total | 132 |

According to the above, the electrical system 80 is overloaded. The overload can be sensed by the main circuit protective device 82 which will eventually isolate the electrical system 80 in response to a sustained overload. As is generally seen from the time-current curves included in FIG. 2, for example, the response time of the main circuit protective device 82 will decrease as the amount of the overload increases. Although the total current is greater than the rated maximum continuous current of the electrical system 80, the apparatus 20 may be configured to selectively isolate one or more of the circuits 1-10 to reduce the total current to 100 amps or less (i.e., removing the overload condition) before the main circuit protective device 82 operates to isolate the entire electrical system 80.

Figure 6:
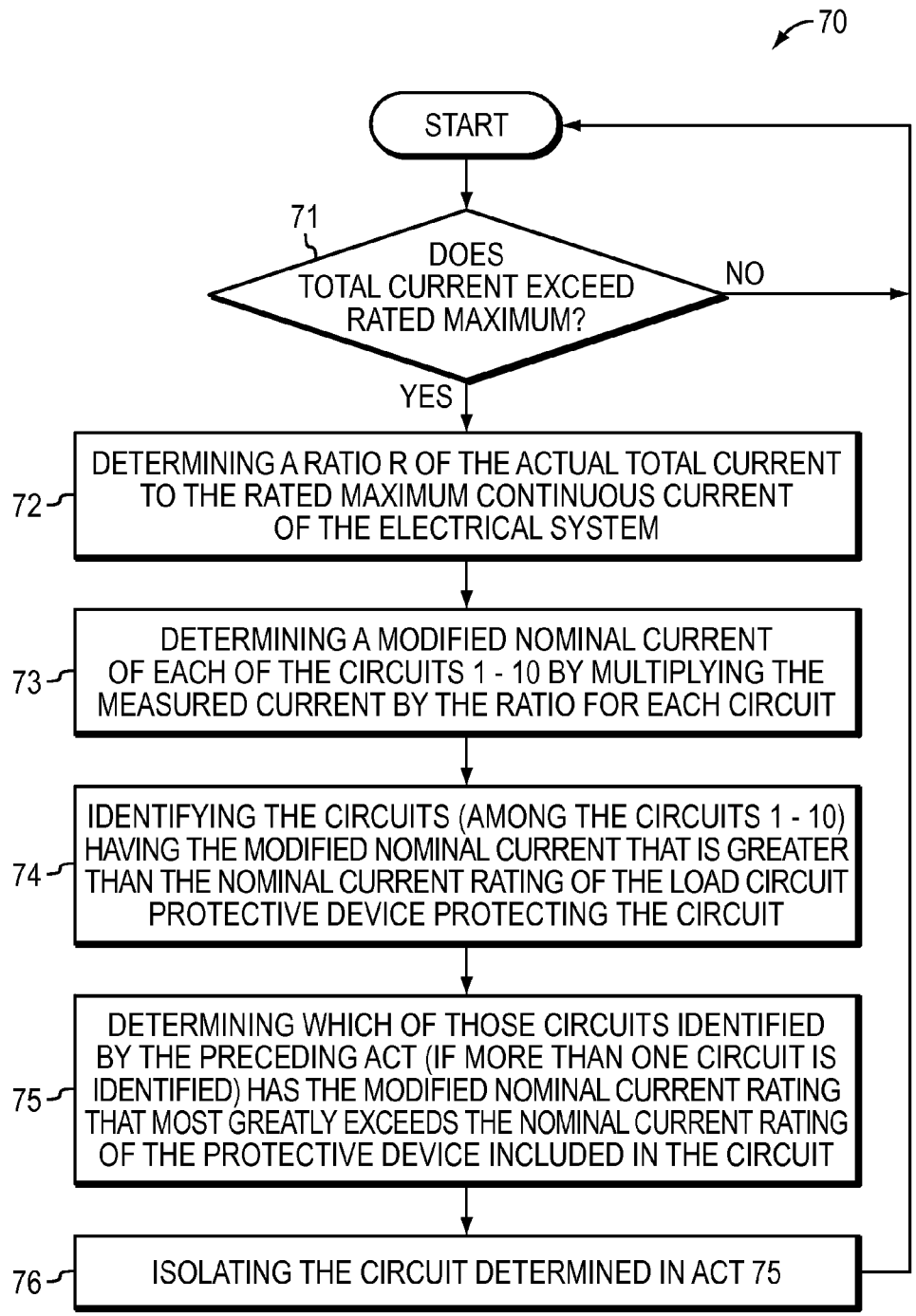
FIG. 6 is a flow diagram of a process in accordance with a further embodiment of the invention.

In one embodiment, the apparatus 20 generally employs a method 70 (FIG. 6) that selects one or more circuits to isolate. In the method 70, in a first act 71, a determination is made as to whether the total current exceeds a maximum value. If the outcome of act 71 is "No", then the method 70 returns to the starting point. If the outcome of act 71 is "Yes", then the method proceeds to act 72, wherein a ratio R of the actual total current to the rated maximum continuous current of the electrical system is determined. Next, at act 73, method 70 proceeds by determining a modified nominal current of each of the circuits 1-10 by multiplying the measured current by the ratio R for each circuit. The method proceeds to act 74 wherein the circuits (among the circuits 1-10) having a modified nominal current that is greater than the nominal current rating of the load circuit protective device protecting the circuit is determined. Next, at act 75, the method proceeds by determining which of those circuits identified by the preceding act (if more than one circuit is identified) has the modified nominal current rating that most greatly exceeds the nominal current rating of the protective device included in the circuit.

The final act 76 includes isolating the circuit determined in act 75, and repeating acts 71-75 until the actual total current no longer exceeds the rated maximum continuous current of the electrical system.

Accordingly, for the example provided by Table 1, the ratio of the actual total current to the rated maximum continuous current of the electrical system is determined as:

$$R=132/100=1.32 \qquad \text{Eq. 8}$$

Applying the ratio R determined at Equation 3 to the circuits described in Table 1 results in the following:

TABLE 2

| Circuit | Measured Current in Amps | Modified Current in Amps |
|---|---|---|
| 1 | 15 | 19.8 |
| 2 | 20 | 26.4 |
| 3 | 5 | 6.6 |
| 4 | 18 | 23.76 |
| 5 | 8 | 10.56 |
| 6 | 12 | 15.84 |
| 7 | 19 | 25.08 |
| 8 | 7 | 9.24 |
| 9 | 14 | 18.48 |
| 10 | 14 | 18.48 |
| Total | 132 | |

Each of circuits 2, 4 and 7 has a modified nominal current that exceeds the nominal current rating of the corresponding circuit protective device. Further, circuit 2 has a modified nominal current that most greatly exceeds the nominal current rating (i.e., 20 amps) of the corresponding protective device (i.e., protective device 84B). In accordance with one embodiment, the controller 30 generates an output signal that is communicated to the circuit protective device 84B which then operates to isolate circuit 2 to decrease the overall loading of the electrical system 80. As a result, the overall load is reduced to 112 amps as illustrated in Table 3 (provided, of course, that the loading in the remaining energized circuits has not varied).

TABLE 3

| Circuit | Measured Current in Amps |
|---|---|
| 1 | 15 |
| 2 | 0 |
| 3 | 5 |
| 4 | 18 |
| 5 | 8 |
| 6 | 12 |
| 7 | 19 |
| 8 | 7 |
| 9 | 14 |
| 10 | 14 |
| Total | 112 |

According to one embodiment, the controller 30 continues the process of evaluating the loading on the electrical system 80. As a result of the continued overload, the ratio R is recalculated with the new loading as follows:

$$R=112/100=1.12 \qquad \text{Eq. 9}$$

The new values of the modified nominal current can then be determined by multiplying the nominal current of the circuits by the new ratio. The result of that operation appears in Table 4.

TABLE 4

| Circuit | Measured Current in Amps | Modified Current in Amps |
| --- | --- | --- |
| 1 | 15 | 16.8 |
| 2 | 0 | 0 |
| 3 | 5 | 5.6 |
| 4 | 18 | 20.16 |
| 5 | 8 | 8.96 |
| 6 | 12 | 13.44 |
| 7 | 19 | 21.28 |
| 8 | 7 | 7.84 |
| 9 | 14 | 15.68 |
| 10 | 14 | 15.68 |
| Total | 112 | |

Using these newly calculated values of the modified currents, circuits 4 and 7 each continue to have a modified nominal current that exceeds the nominal current rating of the corresponding circuit protective device. Here, circuit 7 has the modified nominal current that most greatly exceeds the nominal current rating (i.e., 20 amps) of the corresponding protective device (i.e., protective device 84G). In accordance with one embodiment, the controller 30 generates an output signal that is communicated to the circuit protective device 84G which then operates to isolate circuit 7 to further decrease the overall loading of the electrical system 80. As a result, the overall load is reduced to 93 amps as illustrated in Table 5.

TABLE 5

| Circuit | Measured Current in Amps |
| --- | --- |
| 1 | 15 |
| 2 | 0 |
| 3 | 5 |
| 4 | 18 |
| 5 | 8 |
| 6 | 12 |
| 7 | 0 |
| 8 | 7 |
| 9 | 14 |
| 10 | 14 |
| Total | 93 |

Table 5 illustrates a result in which the isolation of two of the circuits included in the electrical system 80 eliminates the overload condition. Importantly, this result is achieved without operation of the main circuit protective device 82. That is, eight of the 10 circuits remain operational despite the momentary overload. This result is most favorable when compared with the isolation of all 10 circuits by the main circuit protective device 82 where no load shedding had been implemented.

Where the circuit protective devices 84 or associated isolation device (e.g., in the case of a fuse or a manually operated circuit breaker) includes an electrical close operation, the circuits that have been de-energized (e.g., the circuits 2 and 7) may be remotely reconnected to the power source after a suitable delay provided that the total current remains less than the nominal rated current of the electrical system 80. In one embodiment, the reconnection is automatically performed by the apparatus 20. Of course, the resetting/reclosing of the load circuit protective devices and/or isolation devices may also be accomplished manually.

In embodiments described above, a simple linear ratio is used to "derate" individual circuit current measurements. In other embodiments, a more complex formula based on R may be used, for example the square of R may be used in some cases, particularly where a more aggressive current shedding approach is desired.

Although the preceding description concerning FIG. 5 illustrates an electrical system (e.g., the electrical system 80) that includes the main circuit protective device 82, embodiments of the invention may also be effectively employed with electrical systems that do not include a main circuit protective device. In general, embodiments of the invention may be employed to individually isolate circuits that may otherwise overload the electrical system, for example, without the overload being detected until the thermal rating of the system is exceeded.

Figure 10:
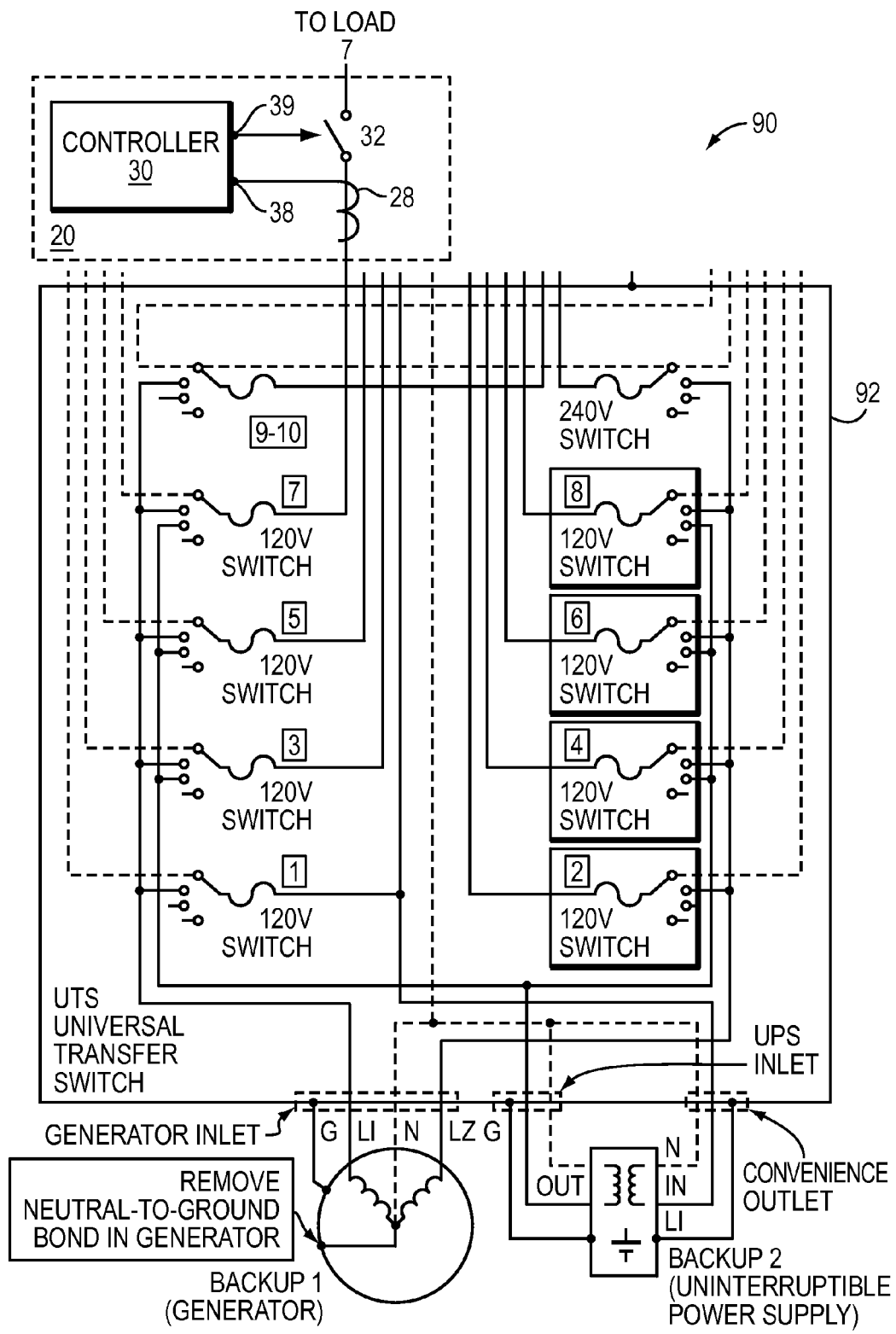
FIG. 10 is a schematic diagram of an apparatus in accordance with another embodiment of the invention

Referring now to FIG. 10, an embodiment of an electrical system 90 including a transfer switch 92 (for example, a Universal Transfer Switch as manufactured by American Power Conversion Corporation of West Kingston, R.I.) is illustrated. Examples transfer switches that may be used with embodiments of the present invention are described in U.S. patent application Ser. No. 10/952,565, filed Sep. 28, 2004, titled "System and Method for Allocating Power to Loads" to Paik et al., which is hereby incorporated herein by reference. In one embodiment, the apparatus 20 is used to protect the transfer switch 92 from exceeding its overall thermal capacity. In the illustrated embodiment, the transfer switch includes a total of 10 circuits including circuits 1-9 that operate at 120 volts and circuit 10 that operates at 240 volts. For the sake of clarity only circuit 7 includes the details associated with the apparatus 20 although any or all of the ten circuits can include the apparatus. For example, any or all of the circuits can include an isolation device 32 operable by the controller 30. In some embodiments, a single controller 30 is used for a plurality of circuits while in alternate embodiments each circuit is provided with a dedicated controller.

In the illustrated embodiment a separate fuse provides overcurrent protection to each circuit, however, a main circuit protective device is not employed. As described above, the thermal capacity of the transfer switch 92 may be exceeded without detection due to the aggregate loading of the circuits 1-10 in this situation. Accordingly, the apparatus 20 may be employed to selectively operate one or more isolation devices 32 to reduce the connected load when the controller 30 senses that the aggregate loading of the transfer switch 92 has exceeded the maximum rated thermal loading of the switch. As described above, the apparatus 20 may also be employed to reconnect any circuits that are isolated following a predetermined period in which the aggregate loading of the transfer switch 92 is less than the maximum rated thermal loading of the switch.

The above-described approaches can, in various embodiments, provide a load-shedding scheme that protects one or more critical circuits from being turned off unnecessarily. That is, the circuits 1-10 can be prioritized such that isolation of lower priority circuits occurs before higher priority circuits even where the higher priority circuits have a greater difference between their modified nominal current and the rated nominal current. This approach can substantially reduce downtime for critical loads. In at least one embodiment, approaches described herein may be used to continue to provide power to delayable loads while powering non-delayable loads as described in U.S. patent application Ser. No. 10/952, 565 discussed above.

The current carried in an electrical circuit generally can vary widely from at or below a nominal continuous current (for example, 15 or 20 amps in a residence), to overload current levels that may be 2 or 3 times the nominal current and to short circuit currents that may be tens or hundreds of times greater than the nominal current. Accordingly, overcurrent protective devices should be responsive to a wide range of current.

As mentioned above, current sensing circuitry employed with overcurrent protective devices often employ a current sensor that supplies an output signal corresponding to the sensed current to an ADC. The ADC is employed to convert the analog output signal from current sensing circuitry to a digital signal format for further signal processing by a digital circuit. For example, the controller 30 illustrated in FIG. 1 may include an ADC coupled to the input 38. The accuracy and range of the ADC is limited, however, by the size of the ADC (i.e., the number of bits included in the converter) and the selected resolution of the ADC.

In one example, an ADC includes 8 bits, and accordingly, has a dynamic range of 256 to 1. In general, the resolution of the ADC is determined by the number of bits (e.g., 8) and the current value represented by the maximum 8-bit number (e.g., $2^8-1=255$). Thus, where the maximum value provided by an 8-bit ADC (i.e., 255) represents 100 amps, the resolution of the ADC is 100/256=0.39 amps. In an alternate approach, the desired resolution is first determined and the current value represented by the maximum value of the ADC is then calculated. For example, where each bit represents 0.1 amps, the maximum current that can be accurately represented by the ADC is 0.1×255=25.5 amps. Alternatively, a 16 bit ADC may be employed to increase the dynamic range with the same resolution. That is, at 0.1 amps per bit, a maximum current of 0.1×65,536=6553.6 is the largest current that can be accurately represented.

The above limitations on ADCs employed with current sensing circuitry may result in inaccuracies in current measurements, and accordingly, in inaccuracies in the overcurrent protection employed with the ADCs. In particular, currents above the maximum current that is accurately represented by the ADC can be "clipped." For example, for an 8-bit ADC with a least significant bit representing 0.39 amps, the same digital value (corresponding to 100 amps) will represent each sample where the sensed current is at or above 100 amps. Accordingly, each sample where the analog current is greater than 100 amps will be represented inaccurately. Similarly, for a 16-bit ADC with a least significant bit representing 0.1 amps, the same digital value (i.e., count) will represent each sample where the sensed current is at or above 6553.6 amps.

Figure 7:
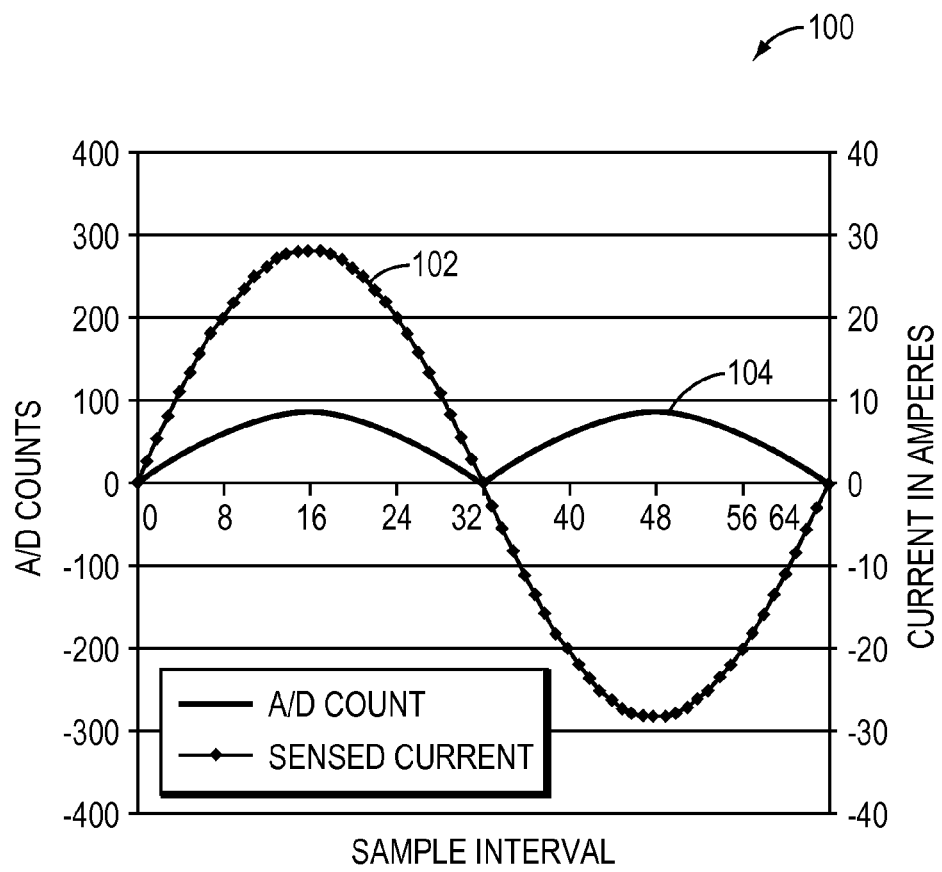
FIG. 7 is a waveform plot in accordance with one embodiment of the invention.
Figure 8:
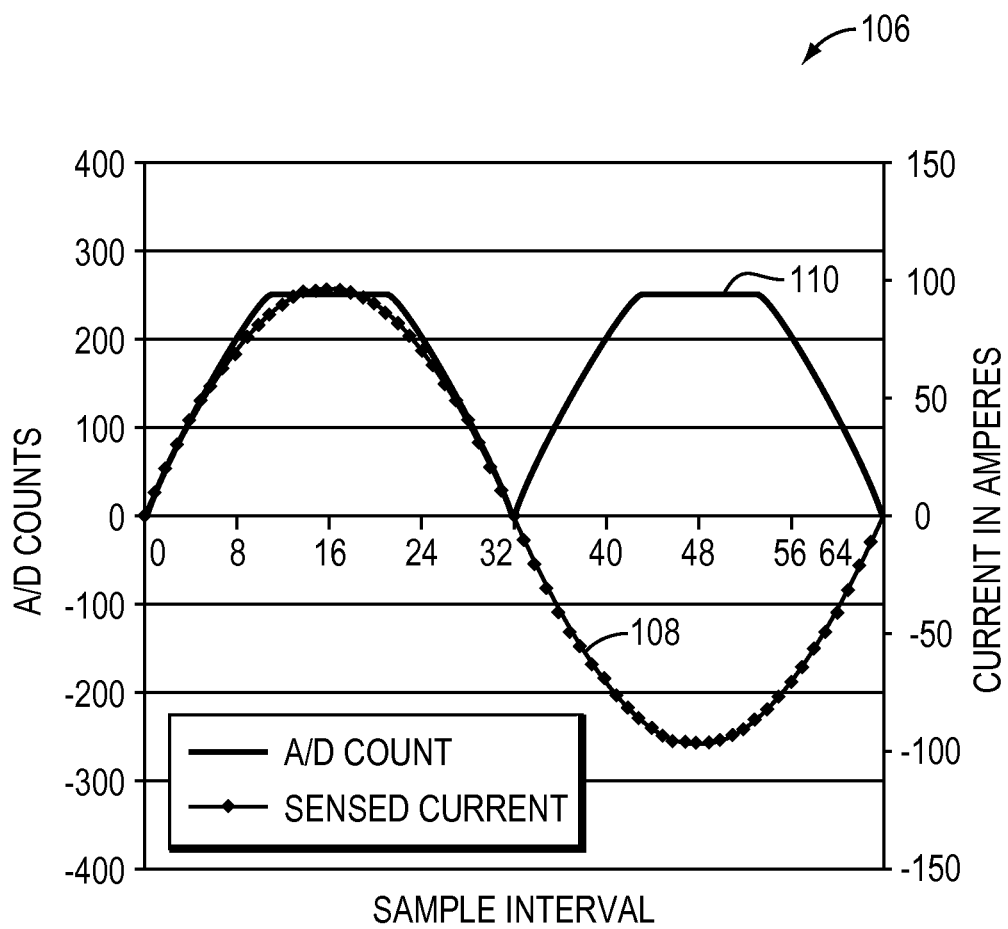
FIG. 8 is a second waveform plot in accordance with one embodiment of the invention.
Figure 9:
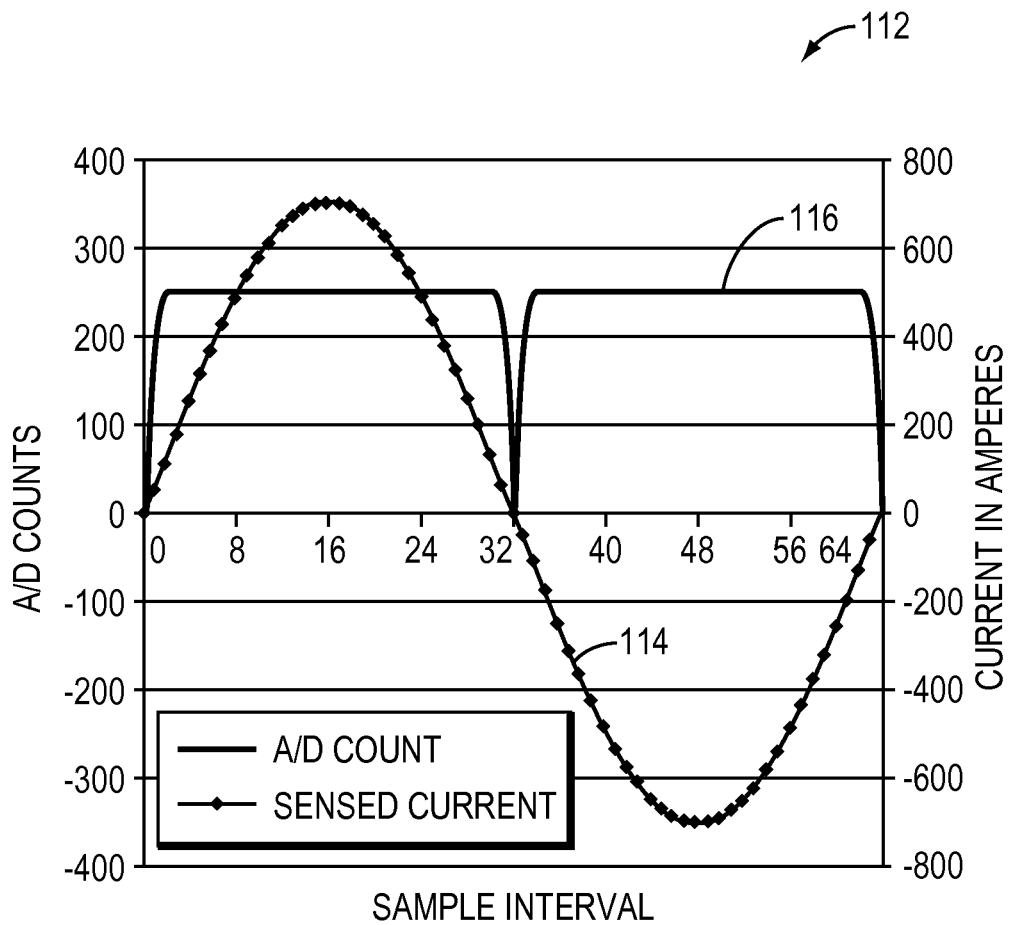
FIG. 9 is a third waveform plot in accordance with one embodiment of the invention.

The above situation is illustrated in FIGS. 7-9. These figures illustrate embodiments including an analog current waveform and a second waveform comprised of a corresponding set of digital samples of a full wave rectified version of the analog current waveform. In one embodiment, FIGS. 7-9 are each associated with a system having a circuit including a 20 amp fuse, and an ADC that is 8-bits at 0.34 amps per bit. The maximum peak current that is accurately sensed by this exemplary system is 86.7 amps which corresponds to approximately 60 amps RMS. Further, the second waveform is based on the analog current waveform being sampled sixty-four times each period.

Each of FIGS. 7-9, includes a horizontal axis corresponding to the digital sample interval, a first vertical axis corresponding to the instantaneous current in amperes and second vertical axis corresponding to a count generated by the ADC. Referring to FIG. 7, a waveform plot 100 includes an analog current waveform 102 and a digital sample-set 104 that corresponds to an output of the ADC for the analog current waveform 102. In FIG. 7, the sensed analog current is 20 amps RMS or approximately 28 peak amps. Because this current value is less than the maximum current that can be accurately represented by the output of the ADC, the digital sample-set 104 does not include any clipping and the analog current is accurately represented by the digital sample-set 104.

Referring now to FIG. 8, a waveform plot 106 illustrates an analog current waveform 108 and a digital sample-set 110 that corresponds to an output of the ADC for the analog current waveform 108. In this example, the sensed analog current is 70 amps RMS or approximately 99 peak amps. Where the circuit is rated for a 20 amp continuous current, the 70 amp RMS current represents an overload. Here, the digital waveform 110 is "clipped" because the sensed current is greater than the maximum current that can be accurately represented by the output of the ADC. In this example, the digital waveform 110 includes eleven consecutive samples (centered around each peak) for which the digital waveform has the same value. That is each of these samples has an identical count. As described above, this result occurs because each of the eleven consecutive samples represents a portion of the analog current waveform where the current is at or above the maximum current that can be accurately represented by the output of the ADC (e.g., 60 amps RMS). As is described in detail below, embodiments of the invention, provide improved current sensing for overloads that include a maximum current that is greater than the current that can be accurately represented by the output of the ADC.

Similarly, FIG. 9 illustrates a waveform plot 112 with an analog current waveform 114 and a digital waveform 116 that corresponds to an output of the ADC for the analog current waveform 114. In this example, the sensed analog current is 500 amps RMS or approximately 707 peak amps. This level of current (i.e., 25 times the rated nominal current of the circuit) has a magnitude that is associated with a short circuit. Because the magnitude of the current is greater than the maximum current that can be accurately represented by the output of the ADC, here too, the digital waveform 110 is "clipped." Further, because the magnitude is so much greater, the clipping occurs throughout most of the period of the analog current waveform 114. Specifically, the clipping begins within two samples of the zero crossing of the analog current waveform.

In various embodiments, the apparatus 20 can employ an approach in which the occurrence and duration of "clipped" values is detected and then used to determine a severity of an associated overcurrent. Such an approach is particularly useful in AC systems where the zero crossing provides an available reference that can be employed when evaluating when and for how long the output of the ADC is at a maximum value (e.g., "clipped"). In at least one embodiment, to account for potential inaccuracies of the ADC, any reading within a few counts of the maximum reading may be considered to be "clipped" and included in the "clipped" region.

In accordance with one embodiment, the controller 30 includes a processor and a memory. Further to this embodiment, the above described approaches can be implemented by one or more algorithms stored in memory which is executed by the processor included in the controller 30.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An overcurrent sensing apparatus comprising:
   current sensing circuitry configured to generate an analog output signal representative of a sensed current;
   an analog to digital converter configured to receive the analog output signal and generate a digital representation of the analog output signal using a plurality of discrete samples, wherein each of the plurality of discrete samples representative of the analog output signal substantially at or above a maximum current value has a substantially identical magnitude; and
   a controller configured to estimate an amount of an overcurrent sensed by the current sensing circuitry by evaluating the samples having the substantially identical magnitude.

2. The apparatus of claim 1, wherein the estimated amount of the overcurrent is determined based on an occurrence of a plurality of consecutive samples having the substantially identical magnitude.

3. The apparatus of claim 1, wherein the estimated amount of the overcurrent is employed to determine when to isolate a circuit protective device in advance of an operation of the circuit protective device responding to the overcurrent.

4. The apparatus of claim 2, wherein the estimated amount of the overcurrent is determined based on a length of time during which the plurality of consecutive samples occurs.

5. The apparatus of claim 4, wherein the length of time is determined based on a quantity of the plurality of discrete samples included in the plurality of consecutive samples.

6. The apparatus of claim 5, wherein a zero crossing of a waveform of the sensed current is employed as at time reference to determine the length of time.

7. The apparatus of claim 1, wherein the estimated amount of the overcurrent is determined based on a length of time during which the plurality of consecutive samples occurs, and
   wherein any of the plurality of discrete samples having a count within a few counts of the substantially identical magnitude is considered to have the substantially identical magnitude.

8. A method of overcurrent sensing, the method comprising:
   generating an analog output signal representative of a sensed AC current;
   generating a digital representation of the analog output signal using a plurality of discrete samples;
   determining those of the plurality of discrete samples having a substantially identical magnitude, wherein the substantially identical magnitude is a maximum magnitude represented by the digital representation; and
   estimating an amount of overcurrent in the sensed AC current by evaluating those of the plurality of discrete samples that have the substantially identical magnitude.

* * * * *